(12) United States Patent
Ziglioli

(10) Patent No.: US 9,187,310 B2
(45) Date of Patent: Nov. 17, 2015

(54) WAFER-LEVEL PACKAGING OF A MEMS INTEGRATED DEVICE AND RELATED MANUFACTURING PROCESS

(71) Applicant: STMicroelectronics S.r.l., Agrate Brianza (IT)

(72) Inventor: Federico Giovanni Ziglioli, Pozzo d'adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/030,867

(22) Filed: Sep. 18, 2013

(65) Prior Publication Data

US 2014/0084397 A1 Mar. 27, 2014

(30) Foreign Application Priority Data

Sep. 24, 2012 (IT) .............................. TO2012A0827

(51) Int. Cl.
*B81B 3/00* (2006.01)
*B81B 7/00* (2006.01)
*B81C 1/00* (2006.01)

(52) U.S. Cl.
CPC ............... *B81B 3/0021* (2013.01); *B81B 7/007* (2013.01); *B81C 1/00269* (2013.01); *B81B 2207/012* (2013.01); *B81B 2207/096* (2013.01); *B81C 2203/0118* (2013.01); *B81C 2203/0792* (2013.01)

(58) Field of Classification Search
CPC ............................ B81C 1/0023; B81B 7/0077
See application file for complete search history.

(56) References Cited

U.S. PATENT DOCUMENTS

| | | | |
|---|---|---|---|
| 6,569,754 B2 * | 5/2003 | Wong et al. ................... | 438/612 |
| 6,846,725 B2 | 1/2005 | Nagarajan et al. | |
| 6,908,791 B2 | 6/2005 | Kocian et al. | |
| 6,953,985 B2 | 10/2005 | Lin et al. | |
| 7,393,758 B2 | 7/2008 | Sridhar et al. | |
| 7,989,248 B2 * | 8/2011 | Kumar et al. ................... | 438/51 |
| 8,049,326 B2 * | 11/2011 | Najafi et al. .................. | 257/698 |
| 8,324,728 B2 * | 12/2012 | Tabrizi ........................ | 257/728 |
| 2005/0142685 A1 | 6/2005 | Ouellet et al. | |
| 2005/0184304 A1 | 8/2005 | Gupta et al. | |
| 2008/0156095 A1 | 7/2008 | Tsuji et al. | |
| 2012/0235256 A1 * | 9/2012 | Zoellin et al. ................. | 257/416 |
| 2014/0008740 A1 * | 1/2014 | Wang et al. ................... | 257/416 |

FOREIGN PATENT DOCUMENTS

EP 2 048 109 A2 4/2009
WO 2008/066894 A2 6/2008

* cited by examiner

*Primary Examiner* — William Coleman
(74) *Attorney, Agent, or Firm* — Seed IP Law Group PLLC

(57) ABSTRACT

A wafer-level package for a MEMS integrated device, envisages: a first body integrating a micromechanical structure; a second body having an active region integrating an electronic circuit, coupled to the micromechanical structure; and a third body defining a covering structure for the first body. The second body defines a base portion of the package and has an inner surface coupled to which is the first body, and an outer surface provided on which are electrical contacts towards the electronic circuit; a routing layer has an inner surface set in contact with the outer surface of the second body and an outer surface that carries electrical contact elements towards the external environment. The third body defines a covering portion for covering the package and is directly coupled to the second body for closing a housing space for the first body.

21 Claims, 7 Drawing Sheets

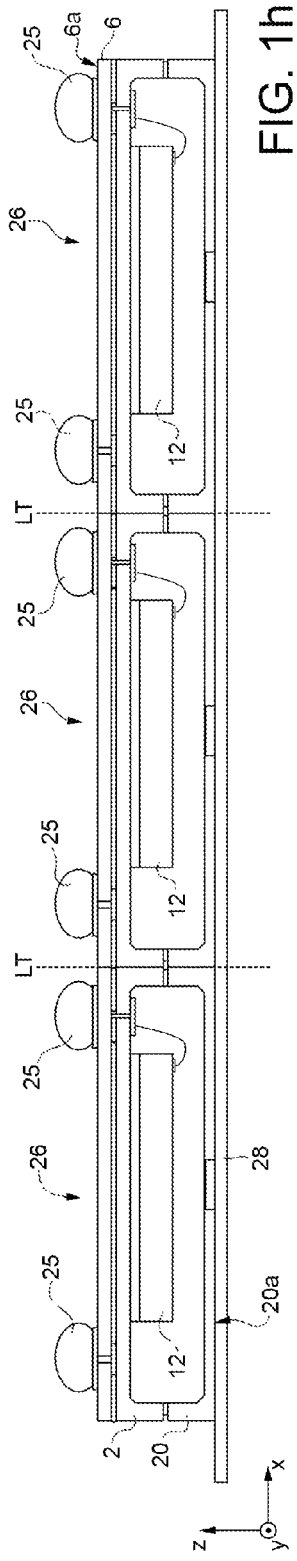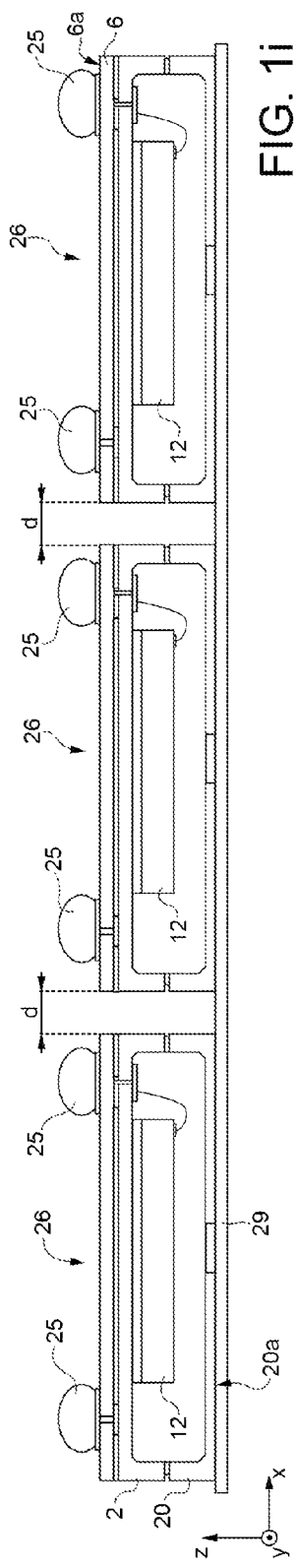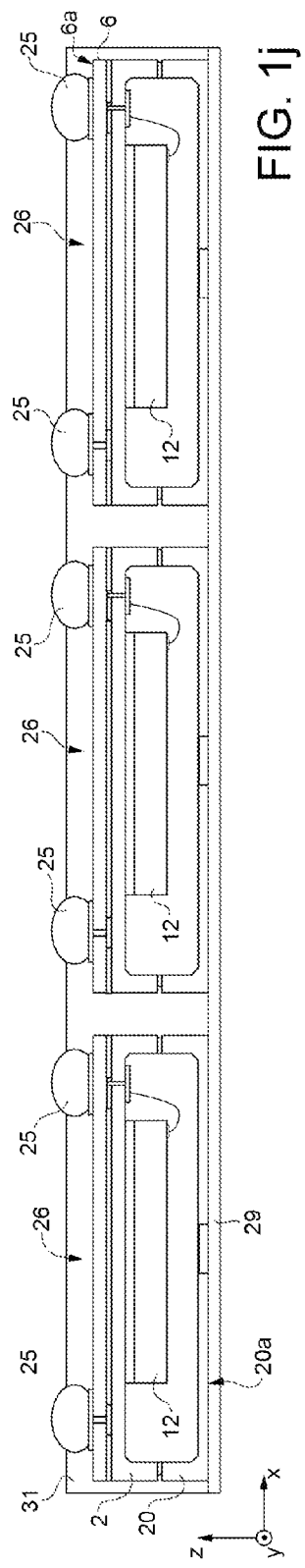

WAFER-LEVEL PACKAGING OF A MEMS INTEGRATED DEVICE AND RELATED MANUFACTURING PROCESS

BACKGROUND

1. Technical Field

The present disclosure relates to a wafer-level packaging of an integrated device of a MEMS (MicroElectroMechanical System) type, hereinafter "MEMS integrated device".

2. Description of the Related Art

In the field of integrated devices, the need is certainly felt to reduce the dimensions to meet increasingly stringent requirements of miniaturization, in particular, in the field of portable apparatuses, such as, for example, smartphones, tablets, or PDAs.

In a known way, a MEMS integrated device generally comprises a first body (usually defined as "die") including semiconductor material (in particular, silicon), integrating a micromechanical structure, operating, for example, as a sensor for one or more quantities to be detected (for example, for providing a pressure sensor or a microphone) and generating an electrical quantity that is a function of the quantity to be detected (for example, a variation of capacitance, a variation of electrical resistance, etc.). As it is known, the die is the result of an operation of sawing or singulation of a wafer, where a plurality of elementary devices are simultaneously provided during the manufacturing process.

A MEMS integrated device further comprises at least one second die including semiconductor material (in particular, silicon), integrating at least one electronic component or circuit, designed to be electrically coupled to the micromechanical structure so as to functionally cooperate therewith. Typically, the second die integrates an ASIC (Application-Specific Integrated Circuit) electronic circuit, electrically coupled to the micromechanical structure, operating, for example, as a reading circuit for reading the electrical quantity detected by the micromechanical structure in the case where the latter operates as a sensor (for example, for carrying out amplification and filtering operations of the same detected electrical quantity). The ASIC electronic circuit may also have further functions for processing and evaluation of the detected quantities, providing more or less complex integrated systems, so-called SiPs (Systems-in-Package).

A MEMS integrated device also generally includes a package, i.e., a container that surrounds, totally or in part, the dice of the device, ensuring protection thereof from external agents and enabling electrical connection towards the external environment. The assembly of the MEMS integrated device, inside the corresponding package, is usually defined as a whole as "chip", and may, for example, be electrically connected to a printed circuit board of an electronic apparatus in which the MEMS integrated device is to be used.

In particular, when the micromechanical structure has deformable elements, for example, a beam or a membrane, which are designed to undergo deformation as a function of the quantity to be detected, the package includes a covering structure, or cap, defining at least one cavity, provided in a position corresponding to the same deformable elements in such a way as to create an empty space that ensures their freedom of movement and does not alter their deformation. Moreover, an access opening is possibly provided through the covering structure, if a fluidic connection with the outside world is required (for example, for entry of pressure or acoustic waves).

A known package structure, defined as a "wafer-level package", is particularly advantageous in the case of portable applications in so far as it allows achieving resulting dimensions that do not depart significantly from those of the dice that are packaged. In short, the corresponding packaging technique envisages use of standard dice micromachining processes also for obtaining the corresponding package, providing at a wafer level, i.e., before the corresponding singulation operation, also the structures for covering and protecting the dice and the corresponding electrical and/or fluidic connections towards the outside environment, thus simplifying and uniforming the overall manufacturing process.

In the case of membrane micromechanical structures or the like (i.e., including further or different deformable elements), the required presence of a cavity entails that a desired reduction of the resulting package dimensions is, however, difficult to obtain, due, e.g., to the thickness requirements for the walls of the cavity, often provided in a composite substrate of a BT (Bismaleimide Triazine) type, having the function of covering structure. In addition, a marked reduction of the dimensions entails a greater difficulty in the manufacturing steps of the covering structure closing the cavity at the top, and major problems linked to mismatches in the thermal expansion coefficients of the materials used.

In general, problems of reliability and stability of performance may arise as the dimensions of the package decrease, which may jeopardize the operation of the resulting integrated devices.

The need is thus felt in the field to improve and further simplify the packaging techniques of MEMS integrated devices, in particular for the purposes of size reduction in the case where membrane micromechanical structures (or the like) are present.

BRIEF SUMMARY

One or more embodiments of the present disclosure are directed to a wafer-level packaging of a MEMS integrated device and a related manufacturing process. In one embodiment, there is provided a package that includes a first body integrating a MEMS and a second body that includes an integrated circuit formed at a first surface and a routing layer formed on a second, outer surface. The MEMS is covered by a third body.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 1a-1k are sections of a wafer-level package in successive steps of a manufacturing process of a MEMS integrated device, according to one embodiment of the present disclosure;

DETAILED DESCRIPTION

Figure 1A:
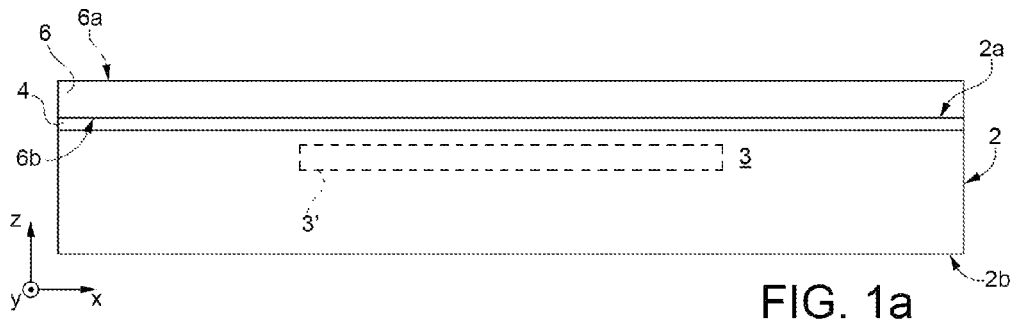

In detail, and with reference to FIG. 1a, an initial step of the manufacturing process envisages provision of an ASIC wafer 2 including semiconductor material, in particular, silicon, integrating an ASIC electronic circuit 3' (represented schematically) only in the same FIG. 1a, and formed, in a known way, by a plurality of active and/or passive electronic components, such as transistors, capacitors, inductors, resistors, amplifiers, etc., provided with known semiconductor micromachining techniques.

The ASIC wafer 2 has a front surface 2a, provided at which is an active region 3 wherein the aforesaid ASIC electronic circuit 3' is made, and a rear surface 2b, opposite to the front surface 2a in a vertical direction z representing the thickness of the ASIC wafer 2, orthogonal to a horizontal plane of main extension of the same ASIC wafer 2, defined by a first horizontal axis x and a second horizontal axis y.

In particular, the ASIC wafer 2 has, on the front surface 2a, a so-called "top metal layer" 4 (represented schematically), where electrical contacts or pads are provided, for connection of the corresponding electronic components (in a known way, not illustrated, dielectric regions are moreover present for separating the electrical contacts from one another).

According to one aspect of the present embodiment, formed above the top metal layer 4 is a redistribution layer (RdL), or routing layer, 6, which has a respective front surface 6a, designed to be in contact with the external environment, and a rear surface 6b, the latter being in contact with the ASIC wafer 2, and defined within are (in a known way, not described in detail herein) electrical paths and contacts such as to redistribute and route the electrical signals coming from the ASIC electronic circuit 3' and from the corresponding electrical contacts in the top metal layer 4, towards the front surface 6a, on which electrical contact elements, the so-called "bumps" or "lands" are to be formed, as described hereinafter. The electrical connection paths in the redistribution layer 6, each connected to at least one electrical contact defined by the top metal layer 4, are electrically insulated from one another by regions of insulating material; in other words, as is on the other hand clear to a person skilled in the field, the redistribution layer 6 includes regions of conductive material and regions of insulating material.

Figure 1B:
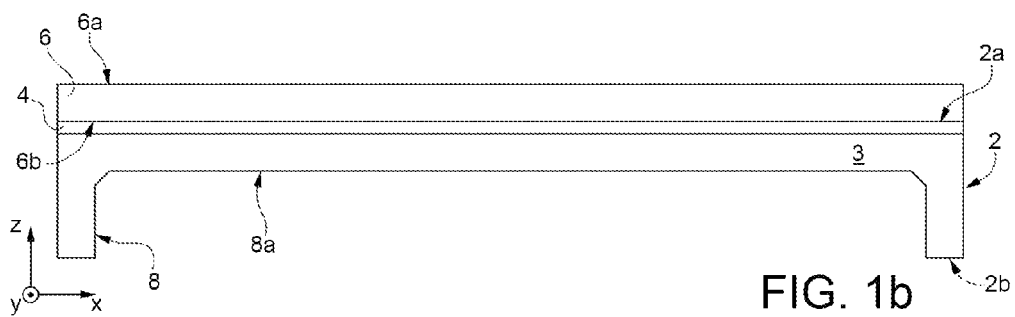

In a subsequent step of the manufacturing process, shown in FIG. 1b, the ASIC wafer 2 is subjected to back etching, leading to formation, starting from the rear surface 2b, of a cavity 8, having a thickness in the vertical direction z comprised, for example, between 300 and 700 μm (and, for example, having a rectangular shape in the horizontal plane xy). The cavity 8, open at the bottom, is enclosed laterally between walls, defined by wall portions of the ASIC wafer 2 and has, at the rear surface 2b of the ASIC wafer 2, a base 8a, which is separated from the front surface 2a of the ASIC wafer 2 by the active region 3 in which the ASIC electronic circuit 3' is provided (here not illustrated).

Figure 1C:
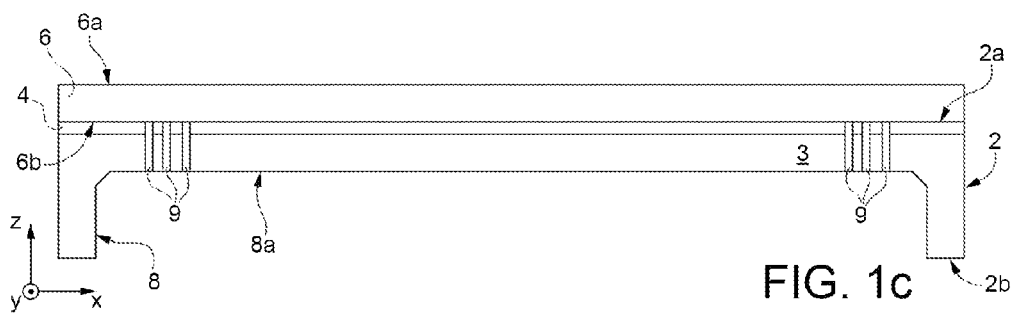

Then (FIG. 1c), through electrical connections, the so-called "electrical vias" 9 are provided through the thickness of the active region 3 and the top metal layer 4, starting from the base 8a of the cavity 8 and terminating at the top metal layer 4, connected to respective electrical contacts in the same top metal layer 4.

Figure 1D:
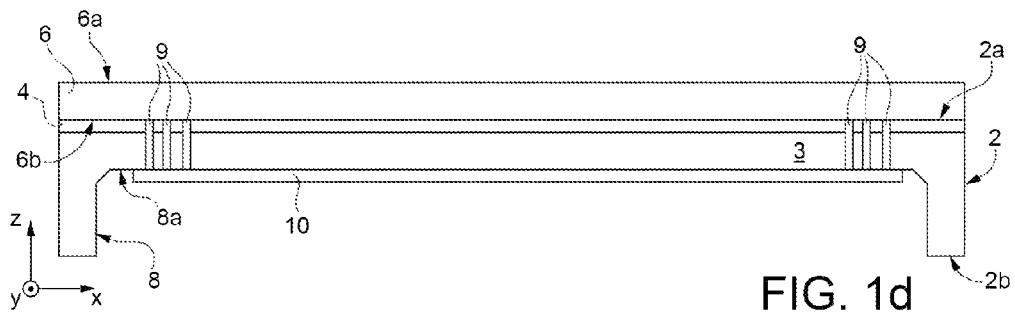

As shown in FIG. 1d, a contact metal layer 10 is now formed and defined above the base 8a of the cavity 8, with corresponding portions set in contact with the electrical vias 9. In a way not illustrated in detail herein but that will be clear to the person skilled in the field, the contact metal layer 10 is suitably defined and patterned to provide electrical paths, traces and electrical contact or bonding pads (electrically insulated from one another by means of appropriate insulating material).

Figure 1E:
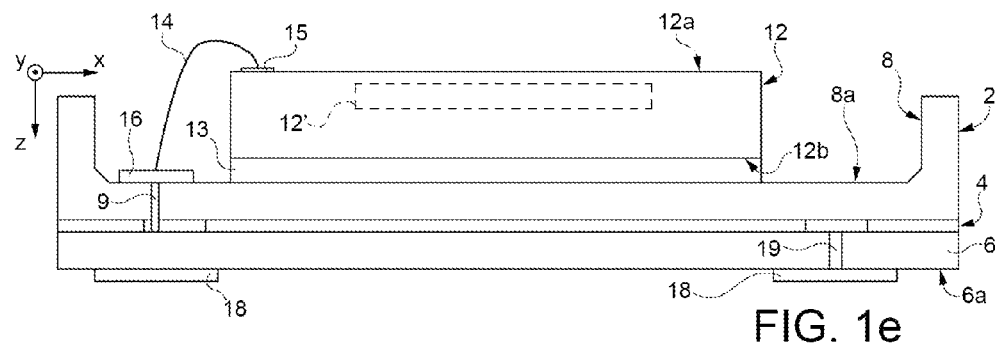

After electrical testing of the ASIC wafer 2 and of the corresponding ASIC electronic circuit 3', in the case where the same electrical test yields a positive outcome, the ASIC wafer 2 is turned upside down, FIG. 1e, and a MEMS die 12 is housed within the cavity 8; the MEMS die 12, shown in a schematic way, integrates a micromechanical structure 12' (illustrated schematically only in the same FIG. 1e), which includes, for example, a membrane or another deformable mechanical element (not illustrated in detail).

In particular, the MEMS die 12 has a front surface 12a, at which the micromechanical structure 12' is provided, and a rear surface 12b, which is mechanically coupled to the base 8a of the cavity 8 by means of an adhesive region 13.

In the embodiment illustrated in FIG. 1e, there is shown only one electrical via 9. It is to be appreciated that any number of electrical vias 9 may be provided. Furthermore, the electrical contacts between the MEMS structure 12' in the MEMS die 12 and the ASIC electronic circuit 3' in the ASIC wafer 2 are provided by means of electrical wires 14 with the so-called wire-bonding technique. In particular, the electrical wires 14 connect electrical pads 15 carried by the front surface 12a of the MEMS die 12 to corresponding electrical pads 16 defined, by means of selective etching and removal, starting from the contact metal layer 10 previously formed on the base 8a of the cavity 8.

Moreover, the electrical connection between the ASIC electronic circuit 3' in the ASIC wafer 2 towards the external environment is obtained by means of electrical contact pads 18 formed on the front surface 6a of the redistribution layer 6, through corresponding vias or electrical paths (here represented schematically and designated by 19), provided in the same redistribution layer 6.

In the embodiment illustrated in FIG. 1e, the thickness of the MEMS die 12 is greater than the thickness of the cavity 8 in the vertical direction z.

Figure 1F:
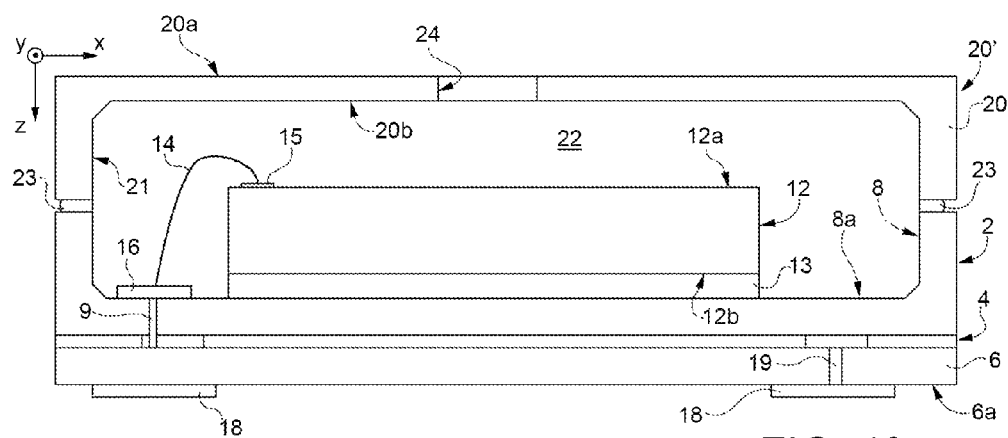

The subsequent step of the manufacturing process, shown in FIG. 1f, envisages coupling of a covering wafer 20 to the ASIC wafer 2 so as to define a covering structure 20' for the MEMS die 12 and the corresponding MEMS structure 12' (here not illustrated).

In particular, the covering wafer 20 has a cavity 21, substantially corresponding, as regards extension in the horizontal plane xy, to the cavity 8, and designed to form a resulting housing space 22 for the MEMS die 12 within the package.

The cavity 21 is delimited laterally by wall portions of the covering wafer 20, which couple to corresponding wall portions of the ASIC wafer 2 by means of bonding regions 23, with the so-called "wafer-to-wafer bonding" technique, i.e., with a direct coupling between wafers (for example, with glass frit or metallic bonding, in the case where the process temperature is compatible, or else with bonding using glues or polymers).

The cavity 21 is moreover delimited at the top by a covering portion of the covering wafer 20, which has, in the embodiment illustrated, a through opening 24 for fluidic communication from outside towards the housing space 22. Alternatively, in a way not illustrated, a number of through openings may be provided, for example, arranged in an array or in a lattice; as further alternative, the through opening 24 may not be present.

The covering wafer 20 has an outer surface 20a, designed to be set in contact with the external environment, and an inner surface 20b, facing the cavity 21.

The covering wafer 20 is, for example, made of semiconductor material, in particular, silicon, or, alternatively, metal or plastic material, and possibly has a metal layer (not illustrated) coating the inner surface 20b in order to provide an electromagnetic shield.

Figure 1G:
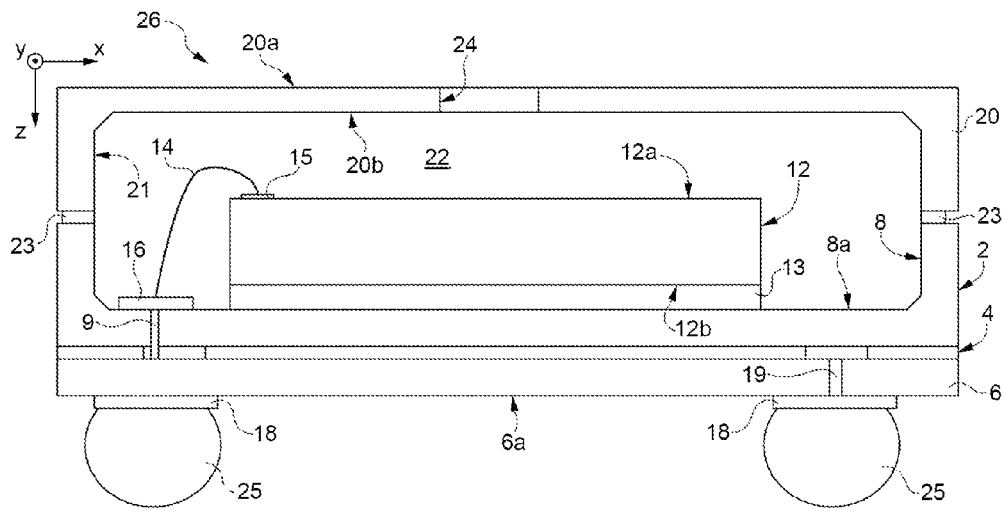

As illustrated in FIG. 1g, electrical-connection elements, designated as a whole by 25, may then be formed on the electrical contact pads 18 set on the front surface 6a of the redistribution layer 6, facing the environment external to the package; the electrical-connection elements 25 may for example be in the form of an array of "balls" or "bumps" (in the case, illustrated in FIG. 1g, of so-called BGA—Ball Grid Array—package) or "lands" (in the case of so-called LGA—Land Grid Array—package).

At the end of this step of the manufacturing process, an elementary assembly 26 is thus obtained.

FIG. 1h shows an enlarged view of the assembly of the aforesaid wafers of semiconductor material and of the corresponding package, which highlights the presence of a plurality of elementary assemblies 26, which repeat, adjacent to one another, in the horizontal plane xy.

In particular, the outer surface 20a of the covering wafer 20 is set in contact with an adhesive tape or film 28 (the so-called "stick foil"), and a sawing operation is then carried out using a purposely provided sawing tool, such as, for example, a diamond saw, along sawing lines LT, set between adjacent elementary assemblies 26, starting from the front surface 6a of the redistribution layer 6.

The individual elementary assemblies 26 may then be electrically connected to external circuits and used for a wide range of applications.

Alternatively, the manufacturing process may proceed with final steps of coating and molding, to provide a protective coating for each elementary assembly 26.

In this case, as shown in FIG. 1i, the elementary assemblies 26, which have been previously separated, are again arranged alongside one another in the horizontal plane xy, on a further stick foil, here designated by 29, with the outer surface 20a of the covering wafer 20 in contact with the same stick foil 29. In particular, two elementary assemblies 26, adjacent to one another, are separated by a distance of separation d in the horizontal plane xy (possibly, different distances of separation may be envisaged in the first and second horizontal directions x, y).

Alternatively, in this step of the process, the elementary assemblies 26 may be arranged alongside one another on a generic resting substrate.

A molding operation is then carried out, as shown in FIG. 1j, for formation of a coating 31, the so-called "mold compound", made, for example, of resin, which surrounds laterally each elementary assembly 26 and moreover coats the front surface 6a of the redistribution layer 6, leaving the electrical-connection elements 25 exposed and accessible from outside. For example, the so-called "film-assisted molding" (FAM) technology may be used. In any case, the coating 31 does not coat the outer surface 20a of the covering wafer 20 and the corresponding through opening 24, which are set, in fact, in contact with the stick foil 29 during the molding operation.

Figure 1K:
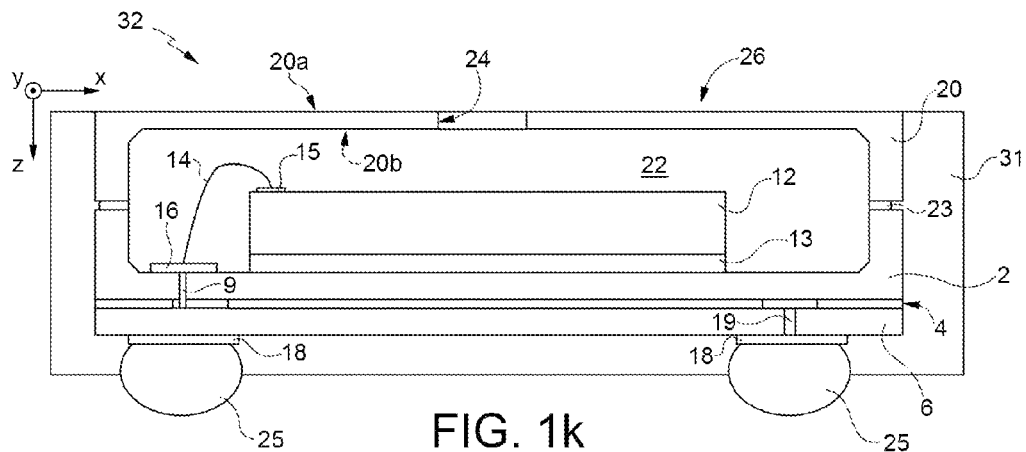

FIG. 1k shows the result of a subsequent final singulation step, where a further sawing operation is carried out, for final separation of the various packaged MEMS integrated devices, which are moreover removed from the stick foil 29 or from the resting substrate. The MEMS integrated device at the end of the manufacturing process is designated as a whole by 32.

Figure 2:
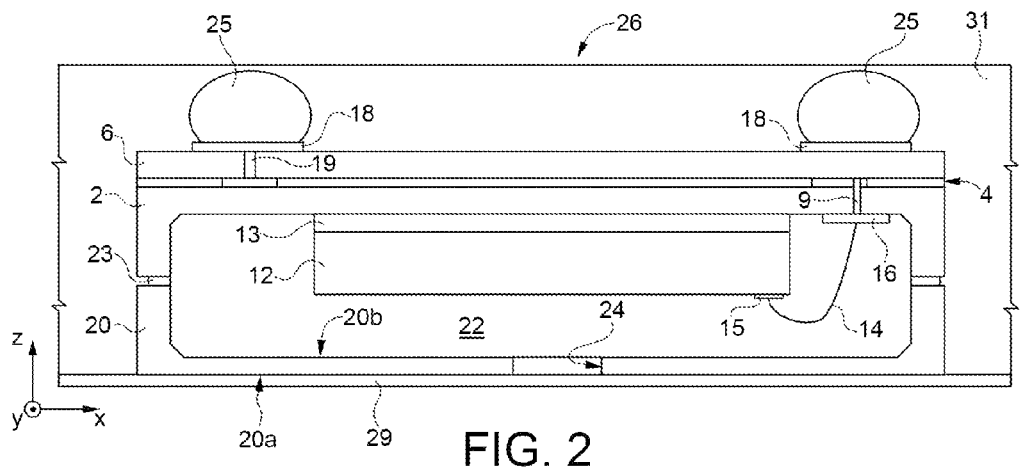
FIGS. 2-5 show variants of the MEMS integrated device of FIGS. 1a-1k.

In the variant solution illustrated in FIG. 2, which corresponds to the process step shown in FIG. 1j, the coating 31 is provided so as to coat also the electrical-connection elements 25.

In this case, the manufacturing process envisages, prior to the singulation step, an operation of thinning, the so-called "backgrinding" operation, for removal of a surface portion of the coating 31 and exposure of the electrical-connection elements 25 (a respective surface portion of which, not in contact with the redistribution layer 6, is possibly removed).

Figure 3:
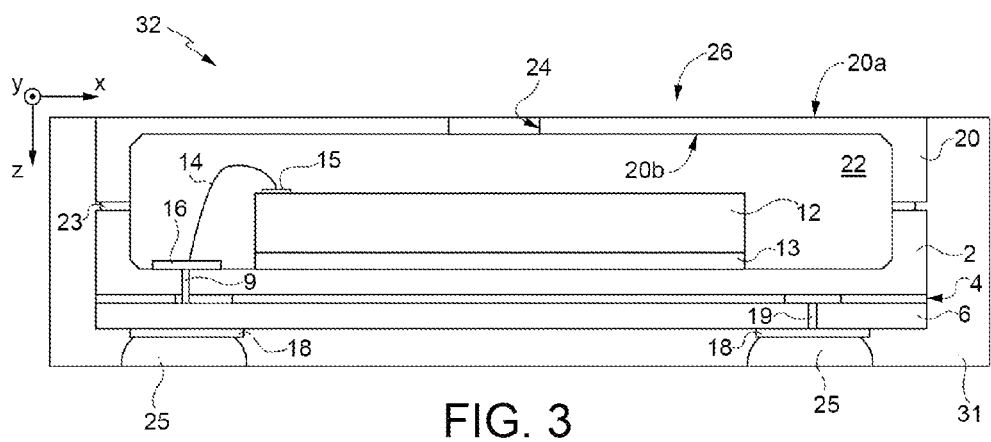

FIG. 3 shows the MEMS integrated device at the end of the manufacturing process, in this variant solution, designated once again by 32.

Figure 4:
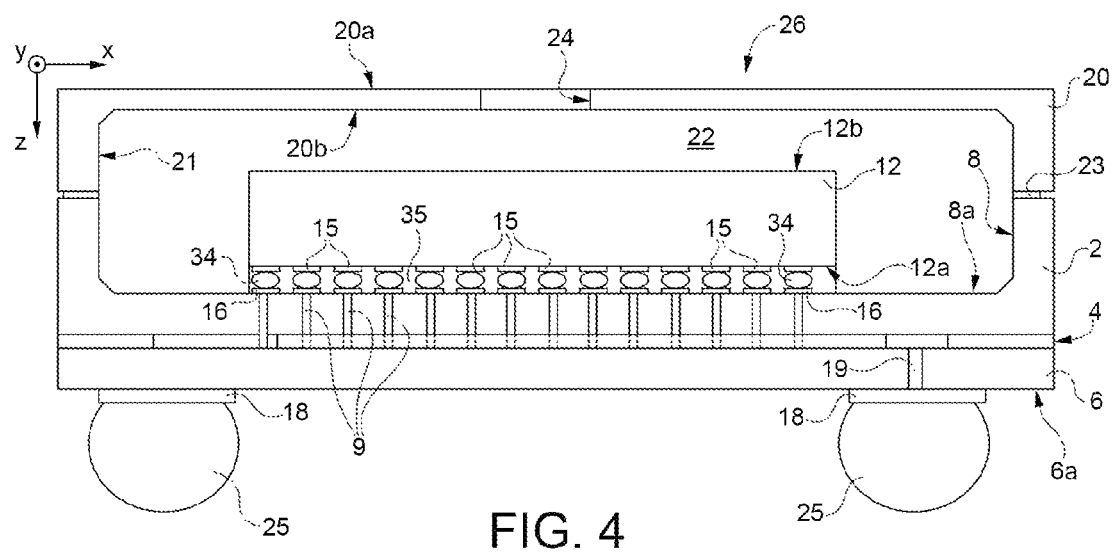

A further variant solution, shown in FIG. 4, envisages a different mechanical and electrical coupling between the MEMS die 12 and the ASIC wafer 2, in particular, using the so-called "flip-chip" technique.

In this case, the MEMS die 12 is housed upside down within the cavity 8, with the front surface 12a facing the base 8a of the cavity 8. Conductive bumps 34 electrically connect the electrical pads 15 carried by the front surface 12a of the MEMS die 12 to the electrical pads 16, which have been defined by selective etching and removal of the contact metal layer 10 previously formed on the base 8a of the cavity 8. An adhesive region 35, made of insulating material, may moreover be provided between the front surface 12a of the MEMS die 12 and the base 8a of the cavity 8.

Figure 5:
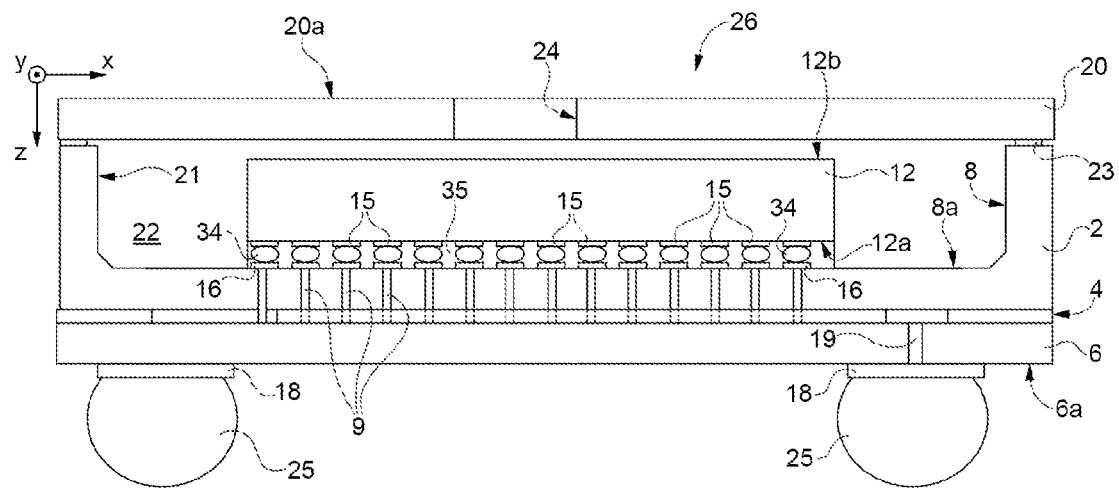

Yet a further variant solution, shown in FIG. 5, referring by way of example to the structure shown in FIG. 4 (but it is evident that similar considerations may apply to the other embodiments), envisages that the covering wafer 20 does not have the cavity 21, being thus constituted by a body of semiconductor, plastic, or metal material having a uniform thickness in the vertical direction z and without cavities, except for the possible presence of the through opening 24.

In this variant, the thickness of the cavity 8 in the vertical direction z is sufficient for housing entirely the thickness of the MEMS die 12, being thus greater than the overall thickness of the MEMS die 12 and, in the case illustrated, of the corresponding conductive bumps 34. The cavity 8 in this case entirely defines the housing space 22.

Figure 6A:
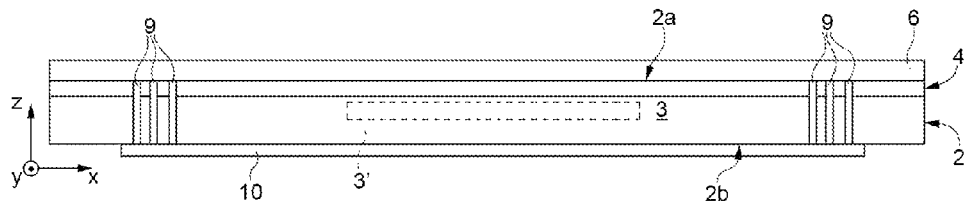
FIGS. 6a-6c are sections of a wafer-level package in successive steps of a manufacturing process, according to a different embodiment of the present disclosure.
Figure 6B:
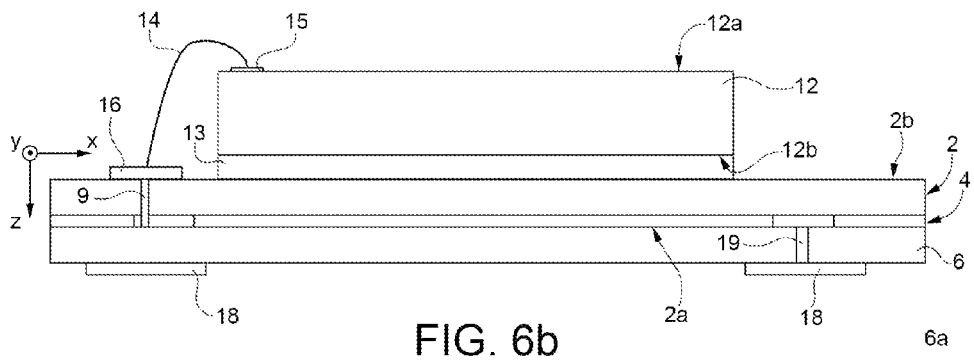

There now follows a description, with reference first to FIG. 6a, of a second embodiment of the present disclosure, which differs from the one illustrated previously basically in that the ASIC wafer 2 is not subjected to back etching that leads to formation of the cavity 8 (which in this case is not envisaged, in fact, in the resulting assembly).

As illustrated in FIG. 6a, the electrical vias 9 traverse in this case the entire thickness of the ASIC wafer 2 so as to connect electrically the top metal layer 4 to the contact metal layer 10, set in contact with the rear surface 2b of the wafer 2 (in this case, without recesses, given the absence of the cavity 8).

The manufacturing process then proceeds in a way similar to what has been illustrated previously, with coupling of the MEMS die 12 on the rear surface 2b of the ASIC wafer 2. In particular, in the variant illustrated, the wire-bonding technique is used for electrical coupling of the MEMS die 12.

Figure 6C:
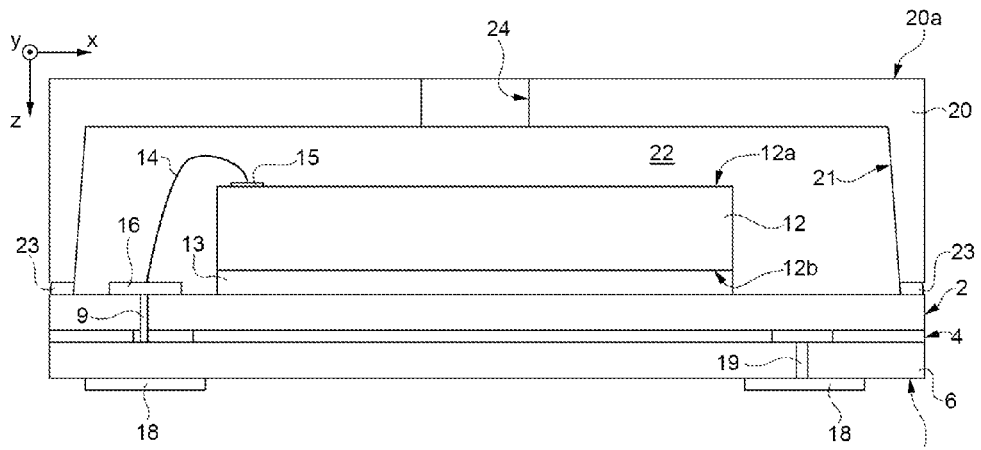

As shown in FIG. 6c, the covering wafer 20 is then coupled on the ASIC wafer 2, using the wafer-to-wafer bonding techniques, to define the cavity 21 that in this case is to house entirely, i.e., for its entire thickness in the vertical direction z, the MEMS die 12 and the corresponding MEMS structure 12' (here not shown); in other words, in this case, the cavity 21 defines entirely the housing space 22 for the MEMS die 12 within the package.

The manufacturing process then proceeds with steps that are altogether similar to those illustrated previously and are not described again in detail, until the elementary assembly 26 and the MEMS integrated device 32 are formed.

Figure 7:
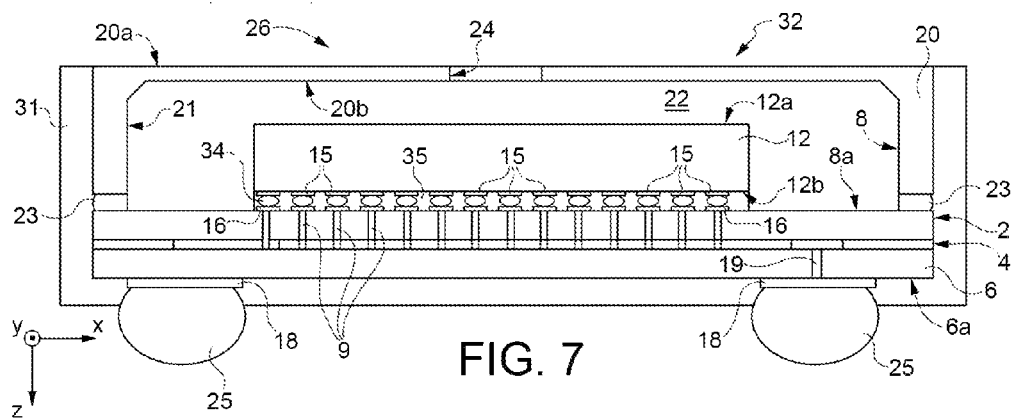
FIGS. 7-8 show variants of the MEMS integrated device of FIGS. 6a-6c.
Figure 8:
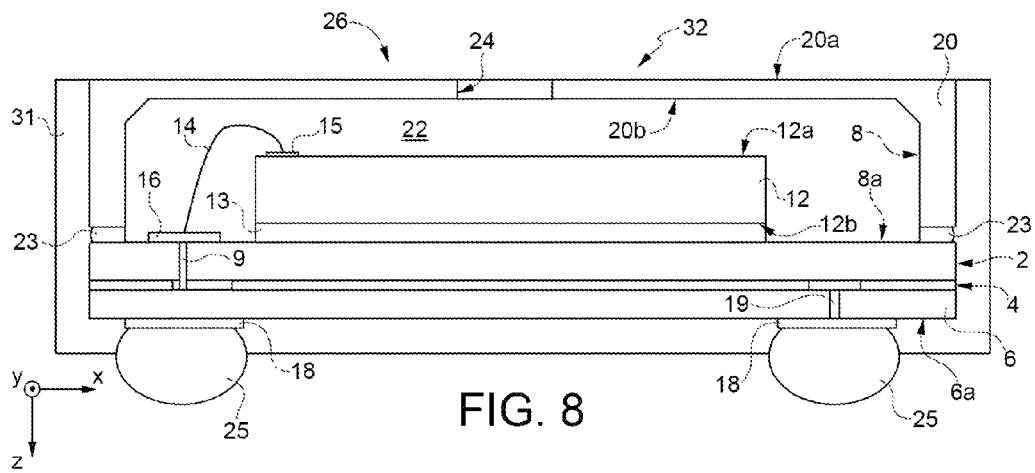

As shown in FIGS. 7 and 8, variant solutions, altogether similar to the ones described previously (and consequently not described in detail again), may be envisaged also in the case of the second embodiment of the manufacturing process.

The advantages of the wafer-level packaging of the MEMS integrated device and of the related manufacturing process are clear based on the foregoing description.

In general, it is once again emphasized that the assembly described enables reduction of the dimensions required for packaging of a MEMS integrated device, albeit enabling creation of a complete system, provided with multiple functionalities (the so-called SiP), in a single package.

In particular, the use of the ASIC wafer 2, with the associated routing layer 6, as a base of the resulting package, for electrical connection to the outside, avoids the need of using base substrates and further intermediate connection structures.

Also advantageous is the wafer-to-wafer coupling between the ASIC wafer 2 and the covering wafer 20, i.e., the direct coupling between the covering structure 20' and the ASIC wafer 2 that integrates the ASIC electronic circuit 3.

In particular, in addition to simplifying the manufacturing process and rendering it more productive, it is thus possible to reduce the problems linked to mismatch in the thermal expansion coefficients of the materials and hence to increase the electrical performance of the resulting integrated devices.

These features thus render the assembly described particularly suitable for portable applications.

Figure 9:
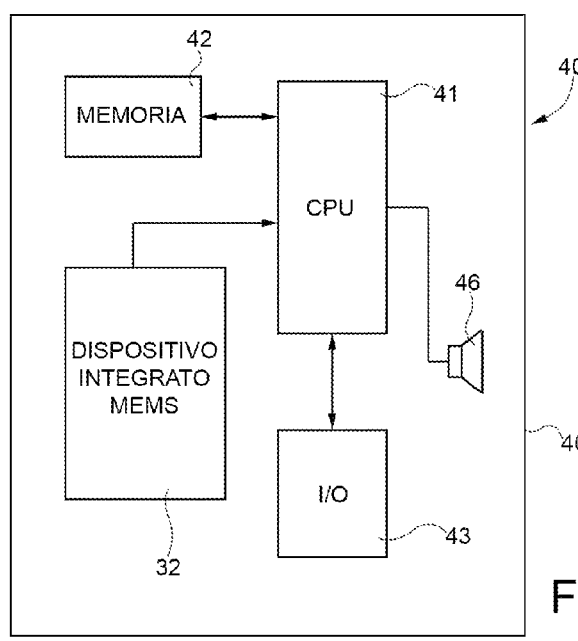
FIG. 9 is an overall block diagram of an electronic apparatus incorporating the MEMS integrated device.

In this connection, FIG. 9 shows an electronic apparatus 40 that uses the MEMS integrated device 32, made as illustrated previously so as to provide a SiP. The portable apparatus 40 is preferably a mobile communication device, such as, for example, a cellphone, a smartphone, a PDA, a tablet, a notebook, but also a voice recorder, a player of audio files with voice recording function, a console for videogames, a photographic camera or a video camera, that is generally able to process, store, transmit, and receive signals and information.

The electronic apparatus 40 comprises, in addition to the MEMS integrated device 32, a microprocessor (CPU) 41, a memory block 42, connected to the microprocessor 41, and an input/output interface 43, for example, a keyboard and/or a display, which is also connected to the microprocessor 41.

The MEMS integrated device 32 communicates with the microprocessor 41, and, in particular, transmits the electrical signals processed by the ASIC electronic circuit 3' associated to the micromechanical structure 12'.

In addition, a loudspeaker 46 may be present, for generating sounds on an audio output (not shown) of the electronic apparatus 40, possibly according to the electrical signals coming from the MEMS integrated device 32 (for example, in the case where the MEMS integrated device 32 is a microphone).

As represented schematically, the electronic apparatus 40 has a printed-circuit board (PCB) 40', electrically coupled to which are the elements of the electronic apparatus 40, and in particular, the MEMS integrated device 32, by means of the electrical-connection elements 25.

Finally, it is clear that modifications and variations may be made to what is described and illustrated herein, without thereby departing from the scope of the present disclosure.

In particular, the package described, and the related manufacturing process, may find application for any micromechanical structure integrated in the MEMS die 12 (for example, for any MEMS detection structure).

Moreover, the solution described may find advantageous application also in the case where the MEMS integrated device 32 includes a greater number of dice or bodies of semiconductor material, for stacked packaging thereof in the vertical direction, with reduced occupation of space.

In particular, in the housing space 22, there may possibly be present the MEMS die 12 and moreover further dice integrating further micro electromechanical structures and/or electronic components, once again exploiting, for the electrical connections, the wire-bonding and/or flip-chip techniques.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A package for a MEMS integrated device, the package comprising:
   a first body including semiconductor material and integrating a micromechanical structure;
   a second body including an active region of semiconductor material and an application specific integrated circuit formed in the active region of semiconductor material and coupled to said micromechanical structure, said second body defining a base portion of said package and having an inner surface and an outer surface, wherein the inner surface of said second body has a cavity having a base, said first body coupled to said base in said cavity, said cavity defining at least in part a housing space;
   first electrical contacts positioned on the outer surface and coupled to said application specific integrated circuit;
   a routing layer having an inner surface in contact with the outer surface of said base portion;
   electrical contact elements positioned on the outer surface of the routing layer, said routing layer providing electrical connection paths between said first electrical contacts and said electrical contact elements; and
   a third body coupled to said second body to close the housing space for housing said first body, said third body defining a covering portion for said package.

2. The package according to claim 1, wherein said cavity in said second body has a depth in a vertical direction that accommodates a thickness of said first body.

3. The package according to claim 1, wherein said third body has a cavity communicating with the cavity in said second body, said cavity of said third body and said cavity of said second body jointly defining said housing space for housing said first body.

4. The package according to claim 1, further comprising second electrical contacts positioned on said inner surface of said base portion, wherein said second body includes electrical through vias that traverse said active region and couple said first electrical contacts to the second electrical contacts, respectively on said inner surface of said base portion, said second electrical contacts being electrically coupled with said micromechanical structure in said first body.

5. The package according to claim 1, wherein said third body has an outer surface facing outwardly of said package and an inner surface facing said housing space, and said third body includes at least one access opening for fluidic access to said housing space.

6. The package according to claim 1, wherein said third body has side portions and said second body has side portions, said side portions of said second and third bodies delimiting said housing space, the package further comprising bonding regions respectively bonding the bonding regions of the second body with the bonding regions of the third body.

7. The package according to claim 1, wherein said third body has a cavity having a depth that is configured to accommodate a thickness of said first body.

8. The package according to claim 1, wherein said electrical contact elements include an array of bumps or conductive lands.

9. The package according to claim 1, further comprising a coating that coats portions of said second body and third body and portions of said outer surface of said routing layer.

10. The package according to claim 1, wherein the micromechanical structure is positioned above the inner surface of the second body and the application specific integrated circuit is positioned below the inner surface of the second body.

11. The package according to claim 4, further comprising a third electrical contact positioned on the first body; and
electrical wires electrically coupling said third electrical contacts to one of said second electrical contacts.

12. The package according to claim 4, further comprising conductive regions located between said second electrical contacts and an active surface of said first body in a flip-chip configuration.

13. The package according to claim 5, wherein said third body includes semiconductor material.

14. An electronic apparatus comprising:
a package that includes:
a first body including semiconductor material and integrating a micromechanical structure;
a second body including an active region of semiconductor material and an application specific integrated circuit formed in the active region of semiconductor material and coupled to said micromechanical structure, said second body defining a base portion of said package and having an inner surface that is coupled to said first body and an outer surface, wherein the inner surface of said second body has a cavity having a base, said first body coupled to said base in said cavity, said cavity defining at least in part a housing space;
first electrical contacts positioned on the outer surface and coupled to said application specific integrated circuit;
a routing layer having an inner surface in contact with the outer surface of said base portion;
electrical contact elements positioned on the outer surface of the routing layer, said routing layer providing electrical connection paths between said first electrical contacts and said electrical contact elements; and
a third body coupled to said second body to close the housing space for housing said first body, said third body defining a covering portion for said package; and
a printed circuit coupled to said electrical contact elements of said package.

15. The package according to claim 14, wherein the micromechanical structure is positioned above the inner surface of the second body and the application specific integrated circuit is positioned below the inner surface of the second body.

16. A process for manufacturing a package including a MEMS integrated device, the process comprising:
integrating at least one micromechanical structure in a first body of semiconductor material;
providing first electrical contacts on a first surface of a second body of semiconductor material, the second body including an active region of semiconductor material and at least one application specific integrated circuit formed in the active region of semiconductor material;
etching a cavity in a second surface of the second body, the cavity having a base surface;
forming a routing layer on the first surface of the second body of semiconductor material;
forming electrical contact elements on an outer surface of the routing layer and forming electrical connection paths between the first electrical contacts and the electrical contact elements;
coupling the first body to the base surface of the cavity of the second body, said cavity defining at least in part a housing space; and
closing the housing space that houses the first body by coupling a third body to the second body.

17. The process according to claim 16, further comprising:
forming electrical through vias in the second body that connect said first electrical contacts to the inner surface of the second body; and
forming second electrical contacts on the inner surface in contact with the electrical through vias that are configured to be couple to the micromechanical structure in the first body.

18. The process according to claim 16, wherein coupling the third body directly to the second body includes using the wafer-to-wafer bonding techniques.

19. The process according to claim 16 further comprising coupling a plurality micromechanical structures, each integrated in a respective body, to respective ones of said further application specific integrated circuits.

20. The package according to claim 16, wherein coupling the first body to the second body includes positioning the first body above the inner surface of the second body, and wherein the application specific integrated circuit is positioned below the inner surface of the second body.

21. The process according to claim 19, further comprising:
carrying out a sawing operation of said second body and third body to define elementary assemblies, each comprising a respective application specific integrated circuit, a respective micromechanical structure and a respective covering structure; and
coating, at the end of said sawing operation, each one of said elementary assemblies with a coating that coats the couplings of said second body and third body laterally, and said respective outer surface of said routing layer at the bottom, leaving said electrical contact elements externally accessible.

* * * * *